United States Patent [19]

Moreau

[11] 3,801,327

[45] Apr. 2, 1974

[54] O-DITHIALANE-PHOTOSENSITIVE COMPOSITIONS

[75] Inventor: Wayne M. Moreau, Wappingers Falls, N.Y.

[73] Assignee: International Business Machines Corporation, Armonk, N.Y.

[22] Filed: July 2, 1970

[21] Appl. No.: 52,131

[52] U.S. Cl. ............... 96/115 R, 96/115 P, 260/79, 260/79.5, 204/159.18

[51] Int. Cl. ............... G03c 1/68

[58] Field of Search ........ 96/88, 35.1, 115 P, 115 R; 260/79, 79.5; 204/159.18

[56] References Cited

UNITED STATES PATENTS

| | | | |
|---|---|---|---|
| 3,338,810 | 8/1967 | Warner | 204/159.18 |
| 2,776,298 | 1/1957 | Bullock | 195/123 X |
| 2,912,386 | 11/1959 | Salzberg | 252/391 X |
| 3,457,073 | 7/1969 | Delzenne | 96/88 X |

OTHER PUBLICATIONS

Journal of American Chemical Society, Vol. 76, pp. 4,348–4,367.

*Primary Examiner*—Ronald H. Smith
*Assistant Examiner*—Won H. Louie, Jr.
*Attorney, Agent, or Firm*—Henry Powers

[57] ABSTRACT

A photoresist composition for use in photolithographic and photomechanical processes comprising organic solvent-soluble colloids sensitized with 1,2 dithiacycloalkane compounds, as well as photosensitive compositions comprising 1,2 dithiacycloalkane alkanoate esters of hydroxy containing colloids; and light sensitive elements coated with such compositions.

30 Claims, No Drawings

O-DITHIALANE-PHOTOSENSITIVE COMPOSITIONS

BACKGROUND OF THE INVENTION

1. Field of the Invention

This disclosure relates to photosensitive compositions, and more particularly to a negative photoresist composition for use in photolithographic and photomechanical processes for photomasking systems employed in the fabrication of printed circuits, microcircuits, semiconductors, printing plates, dies and the like normally employed in other lithographic arts.

2. Description of the Prior Art

The broad class of 1,2-dithiacycloalkanes, also called as "o-dithialanes" are well known in the prior art, and an enumeration of these compounds may be found on pages 3,991*s*–3,995 *s* of the "Chemical Abstracts", Sixth Collective Index Subjects D G., vols. 51–55, 1957–1961. Among the applications for these compounds (particularly 1,2-dithialane) is their use to inhibit acid attack on steel as set forth in U.S. Pat. No. 2,912,386, and in controlling biological activity of thioctic acid (e.g. 1,2-dithiacyclopentane-3-pentanoic acid) as set forth in U.S. Pat. No. 2,776,298.

In addition these o-dithialanes have been employed in biosynthesis or photosynthesis studies as set forth in the Journal of Organic Chemistry vol. 30, pp. 4,008–10 (1965) and in the Journal of American Chemical Society vol. 76, pp. 4,348–4,367 (1954). In these studies of the o-dithialanes, their photolytic or radical transfer activity were investigated for use as agents with chlorophyll (chl) or alone in forming active disulfide building blocks in the photosynthesis of plants. With chlorophyll, the following reactions have been hypothesized

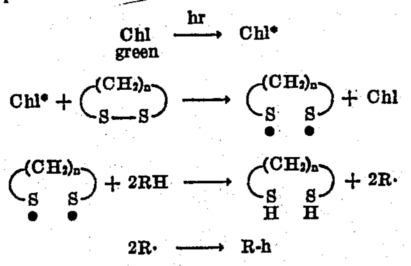

When used alone as a sensitizer, the reactions hypothesized are:

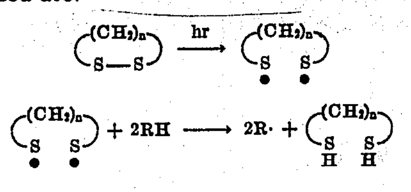

These o-dithialanes form a distinct class of compounds for contrast with other conventional light sensitive sulfur compounds employed as light sensitizers or initiators in photosensitive or photoresist compositions.

A wide variety of such light sensitive organic sulfur compounds for use as initiators for photoresist compositions can be found on pages 167–170 of Jaromir Kosar's comprehensive text "Light Sensitive Systems" published in 1965 by John Wiley & Sons, Inc., New York. Typical of such photoresist system containing organic light-sensitive sulfur compounds as initiators is that described in U.S. Pat. No. 2,460,105 employing organic disulfide, such as diaryl and diaroyl disulfides, as "catalysts" for the photopolymerization of a large class of vinyl and vinylidene compounds.

As indicated in the above noted Kosar's text "Light Sensitive Systems" such organic light sensitive disulfide compounds known heretofore have been characterized by their dissociation on irradiation into two integral monoradicals which normally do not enter into or form part of the final polymeric structure.

Another class of organic compounds, proposed in U.S. Pat. No. 3,046,126 as sensitizers for photopolymerization or organic colloids, are a class of thiophenes compounds nitrated in the thiophene ring. Of particular interest in this patent is the observation therein that "Thiophene itself does not exhibit any light sensitivity, and it was quite surprising* to find that nitrothiophene, the simplest compound of the group* was light sensitive. The nitro group must therefore be regarded as the photoactive group in the molecule, since the thiophene substitution products which do not contain any nitro group are insensitive to light."

SUMMARY OF THE INVENTION

It has now been discovered, in accordance with this invention, that the light sensitivity of the 1,2-dithiacycloalkanes (e.g. o-dithialanes) provide a new class of photosensitizers for novel photoresist compositions, when incorporated with conventional film-forming organic solvent-soluble colloids, to form polymeric images on suitable supports upon exposure to light and development in appropriate solvents. Associated novel photosensitive or photoresist elements are also formed by coating a solution of the film-forming light-sensitive compositions on suitable supports by any of the methods well known in the art.

These 1,2-dithiacycloalkanes (or o-dithialanes) are characterized by a homopolar clevage of the ring structure upon irradiation to form an integral diradical which not only initiates, but also functions as a cross-linking agent in cross-polymerization of the organic colloid or polymeric binder of the photoresist composition. Based on experiment studies the following insertion reactions for the o-dithialanes are hypothesized in conjunction with unsaturated colloids in photoresist composition of this invention:

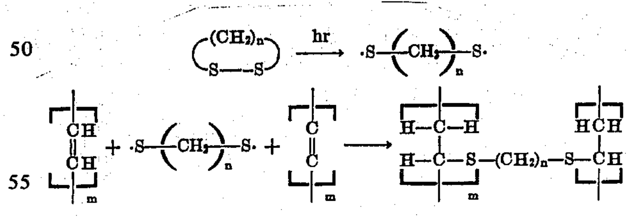

In addition to the foregoing additive reaction, experimental studies indicated that these o-dithialanes initiate cross-polymerization of the base binder by another insertion reaction on saturated carbon as follows:

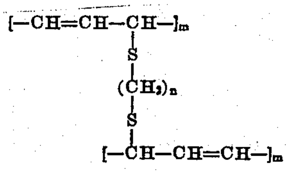

In view of the involvement of both insertion reactions, the following probable molecular structure is also indicated:

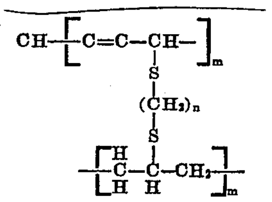

Accordingly, as will be appreciated, the preferred organic colloids are the unsaturated polymers wherein both insertion reactions are available with these o-dithialanes. It was found that unsaturated polymeric binders or colloids gave higher speeds (e.g. insolubilized at a faster rate) on irradiation.

As more fully described below, the photosensitive compositions of this invention may be formulated by discrete admixture of the 1,2-dithiacycloalkanes with unsaturated organic solvent-soluble colloids. Also comprehended within this invention are photosensitive compositions formed by the esterification of hydroxy containing polymeric materials such as polyvinyl alcohol and epichlorhydrin-epoxy copolymers with a 1,2-dithiacycloalkane alkanoic acid halides such as 1,2-dithiacyclopentyl-5-pentanoyl chloride.

Accordingly it is an object of this invention to provide novel photosensitive composition.

Another object of this invention is to provide novel negative photoresist composition.

A further object of this invention is to provide novel photosensitive polymers for use in use as photoresist compositions.

It is a further object of this invention to provide novel photoresist compositions of an organic solvent-soluble colloid incorporating a 1,2-dithiacycloalkane constituent as a light sensitizer therefore.

A still further object of this invention is to provide a new class of photoresist compositions comprising a 1,2-dithiacylloalkane sensitizer and an organic solvent-soluble colloid as the polymeric binder or base resin therewith.

It is also an object of this invention to provide novel light sensitive elements comprising a support coated thereon with a photosensitive composition of an organic solvent-soluble colloid constituent and a 1,2-dithiacycloalklane constituent.

The foregoing and other objects, features and advantages of the invention will be apparent from the following more particular description of preferred embodiments of the invention.

DESCRIPTION OF THE PREFERRED EMBODIMENT

The foregoing indicated objects are obtained in accordance with this invention, by a film forming photosensitive composition comprised of an organic solvent-soluble colloid constituent and a 1,2-dithiacycloalkane constituent which, in solution, may be coated on a suitable support by any of the conventional techniques known in the art.

The 1,2-dithiacycloalkane constituent is employed as the light sensitizer or initiator for the associated colloid or polymeric binder and is characterized by either a saturated or unsaturated alicyclic ring structure containing adjacent sulfur members in the 1,2-positions. These 1,2-dithiacycloalklanes are also commonly known as o-dithialanes, typical of which, comprehended in this invention, may be found in the enumeration set forth on pages 3,991*s*–3,995*s* of the "Chemical Abstracts" Sixth Collective Index, Subject, D–G, vs 51–55, 1957–1961. Although the general class of 1,2-dithiacycloalkanes find applicability to this invention, the preferred compounds of particular application in this invention, for practical considerations, have a thermal stability at storage temperatures for reasonable shelf life prior to use. As will be recognized, shelf life requirements need not be considered where these o-dithialanes are immediately utilized following their synthesis.

Normally the ring size of these o-dithialanes affects only the solubility of the compounds and shifts the absorption band thereof. In general the o-dithialane ring will contain from two to five methylene groups where the compounds will have the structure.

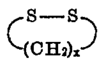

where $x$, accordingly, will vary from 2 to 5. In the preferred form $x$ (e.g number of methylene groups) will have a value of 2 to 4, with optional values of $x$ being 3 to 4.

Typical of the derivative of the o-dithialanes (e.g. 1,2-dithiacycloalkanes) are the group having the formula:

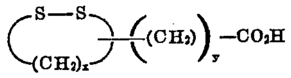

in which $x$ has the values indicated above, and where $y$ may extend from 0 to 5 with a preferred range of 1 to 4.

The following representative examples illustrate the light sensitive o-dithialanes comprehended as initiators in the photoresist compositions of this invention: 1,2-dithiacyclobutane; 1,2-dithiacyclopentane; 1,2-dithiacyclohexane; 1,2-dithiacyclopheptane; 1,2-dithiacyclopentane-3-methanoic acid; 1,2-dithiacyclopentane-3-propanoic acid; 1,2-dithiacyclopentane-4-ethanoic acid; 1,2-dithiacyclopentane-4-butanoic acid; 1,2-dithiacyclohexane-3-ethanoic acid; 1,2-dithiacyclohexane-4-pentanoic acid; 1,2-dithiacyclopentane-4-methyl methylate; 1,2-dithiacyclopentane-3-acetoxy-5-pentanoic acid; 1,8-dithiabenzene; naphthalene-1,8,4,5-tetradisulfide; 4,5-benzyl-1,2-dithiacyclohexane; and 3,4-benzo-1,2-dithiacyclobutane.

A wide variety of film-forming solvent-soluble colloid binders heretofore employed in the art may also be used in the photoresist compostions comprehended in this invention. Typical of these colloids (e.g. base resins, polymeric binders, prepolymers, etc., as they are alternatively known) are those set out in U.S. Pat. No. 2,852,379 and which typically include natural polymers, chemically modified natural polymers, synthetic polymerization products and the like. Among the natural polymers is included sulfur-vulcanizable natural rubber, cellulose, starch, and the like, including esters thereof particularly those containing substantial amounts of free hydroxyl groups.

Synthetic polymerization products include synthetic rubbers and polymeric resins. The synthetic rubbers include polymers and copolymers of 1,3-diolefins, isoprene, neoprene and the like. Copolymers particularly useful are those containing a minor proportion, e.g. less than 50 percent by weight, of an unsaturated compound, such as styrene, isobutylene, acrylonitrile, etc., some of which are commercially available as Buna S, Buna N, Butyl, etc. Also comprehended in the colloidal materials of this invention are cyclized and oxidized rubbers.

Typical polymeric resins which, as indicated above, can be employed as colloids in this invention are polyvinyl alcohol, and copolymers comprising in their polymeric structure a substantial amount of vinyl alcohol groups, and also includes polystyrene, polymethymethacrylate, polyvinyl cinnamate, cyclized polyisoprene, epichlorolydrinepoxy and the like. Although any of the conventional colloids are comprehended for the compositions in which the sensitizer can be dispersed, however in the preferred form particularly effective compostions are obtained in which the sensitizer is soluble in the colloid.

The relative proportions of the colloid and the o-dithialane sensitizers may be varied as desired or as conditions may require but ordinarily the proportions thereof in the dried photosensitive compositions will be, by weight within the range of about 95 to about 65 percent of the colloid and about 5 to about 35 of the sensitizer. Usually, the range of the sensitizer in the dried composition is from about 5 to about 35 wt. %, and the preferred range is from about 10 to about 20 wt. %.

The specific concentration of the sensitizer can generally vary over a wide range, but will ordinarily be dependent on the specific sensitizer used on the thickness of the photosensitive layers desired or required, and on the specific applications of the photoinsolubilized layer. In each individual case the optimum concentrations can be determined by techniques well known in the art.

In use, the photosensitive compositions of this invention are applied as a solution, in a suitable solvent commonly employed in the art for coating polymers on suitable supports used conventionally for photoresist elements. Typical solvents include the lower alcohols such as methanol, ethanol, propanol, etc., ketone such as cyclohexanone, 2-butanone, acetone etc., dimethyl formamide, tetrahydrofuran, pyridine, benzene, toluene, etc., and mixtures thereof. The specific choice of solvents will, in general, depend on the sensitizer and colloid binder used.

Photoinsolubilization (e.g. cross-linking) of the colloids can be effected by simply exposing the colloid/-sensitizer composition to a source of actinic radiation from any source and of any type. The light source need only furnish sufficient amount of radiation, preferably ultraviolet, to induce the desired insolubilization of the composition. Typical sources of light include carbon arcs, mercury vapor lamps and the like. The effect of the 1,2dithiacycloalkane is not always to insolubilize the photoresist composition to all organic solvents, and in some cases it may be necessary to choose the developing solvent with a certain degree of care. In the case of most rubber colloids, the choice is fairly wide.

The film-forming photosensitive compositions can be coated on the support by any of the conventional methods used in the photoresist art which can include dipping, spraying, spin coating, etc. After application of the coating the solvent is driven off, as by evaporation, to leave a thin coating of the photosensitive composition on the support, after which the coating may be exposed to suitable radiation in accordance with conventional techniques employed in the photomechanical and photolithographic arts. Typical supports include any various base material to which the photosensitive compositions will adhere, such as glass, paper, resin impregnated or reinforced paper, solid resinous sheets, metal sheets such as aluminum, zinc, magnesium, copper etc., and the like.

After the support member has been coated with a film of the photosensitive composition and dried, it is then exposed to light (e.g. ultraviolet) in a predetermined pattern corresponding to the ultimate pattern desired. Generally such exposure is effected by means of suitable masks, negatives, stencils, templates, etc. In any event, such exposure induces photopolymerization or insolubilization of the coating in the exposed areas thereof. The exposed coating may then be developed by treating it in any suitable solvent such as listed above. Generally, because of the differential insolubility which has been induced the solvent developer may be the same solvent in which the colloid and sensitizer were originally dissolved, e.g. prepared, in. In the development stage, the unexposed areas are softened and dissolved off, leaving a resist image corresponding to the exposed areas in which photoinsolubilization was induced.

If desired, the coated plate may be subject to optional heat treatments to enhance the resolution of the exposed areas. For example, the exposed coating may be prebaked at low temperatures, e.g. about 50 to about 80°C for a short period of time, e.g. about 1 to about 10 minutes to increase the polymerization of the coating. Also, post bake treatment may be employed after development to increase the strength of the resist image. For the post-bake, the film and support may be oven baked below the softening point of the support for suitable times (which illustratively may be of the order of about 100°C and 20 minutes) depending on the further processing requirements for the support.

A typical application for the photosensitive compositions of this invention is in the fabrication of semiconductor devices. In such an application, the photosensitive composition may be coated on an oxidized surface of a semiconductor substrated followed by exposure of the coating (after drying) in a predetermined pattern, via a mask corresponding to area of the oxide desired to be bared for further processing. The exposed coating is then developed to bare the oxide layer for further processing which, for example, may then be conventionally etched into appropriate openings for diffusion metallization or other operation as desired or required.

However, it is to be understood that the photosensitive compositions of this invention are also suitable for other uses as indicated above. For example they can be applied for the manufacture of printed circuits, chemical milling and in the various general fields of photomechanical and photographical reproductions, lithography and intaglio printing, such as offset printing, silk screen printing, manifold stencil sheeting coatings, lithographic plates, relief plated, gravure plates and the like.

Although discrete admixture of the sensitizer and colloids have been described in detail heretofore, as indicated above, effective photosensitive compositions are also obtained by esterification of 1,2-dithiacycloalkane alkanoic acids with hydroxy containing colloids such as polyvinyl alcohol, cellulose, epichlorohydrin-epoxy, and the like as more fully described in U.S. Pat. Nos. 3,278,305, No. 3,387,976, and No. 3,427,161. Generally these light sensitive materials can be obtained by esterification of hydroxy containing polymeric colloids with a halide of the 1,2-dithiacycloalklane-alkanoic acid. These o-dithialkanoic acids will have the formula

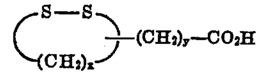

where X is an integer in the range of 2 to 9, and preferably 3 to 5, and Y is in the range of 0 to 5 and preferably 0 to 4. In general these 1,2 dithiacycloalkane alkanoic acids sensitize, upon esterification the various conventional polymeric colloids having a hydroxy containing backbones.

The hydroxy containing colloid and a 1,2-dithiacycloalkane alkanoic acid halide (herein referred to as 1,2 dithia esterifying agent for convenience), are prepared by classical reaction in a suitable solvent. The 1,2 dithia esterifying agent reacts with the hydroxyl group of the colloid to produce 1,2 dithiacycloalkane-alkanoate side chains attached to the colloid backbone by ester linkages. Numerous solvents are suitable for use, typical of which are dichloromethane, dimethylformamide, pyridine, ehtanolamine, water, and ether with pyridine and dichloromethane being preferred. A typical reaction of the foregoing may be represented by the esterification of a 1,2 dithiacyclopentane-pentanoic acid chloride with a phenoxy resin such as an epichlorohydrin-phenoxy of the above indicated U.S. Pat. No. 3,387,976 obtained by the copolymerization of 2,2-bis (4-hydroxy phenyl) propane and epichlorohydrin. This reaction with a phenoxy having a recurring structure with a secondary hydroxyl group therein is illustrated below:

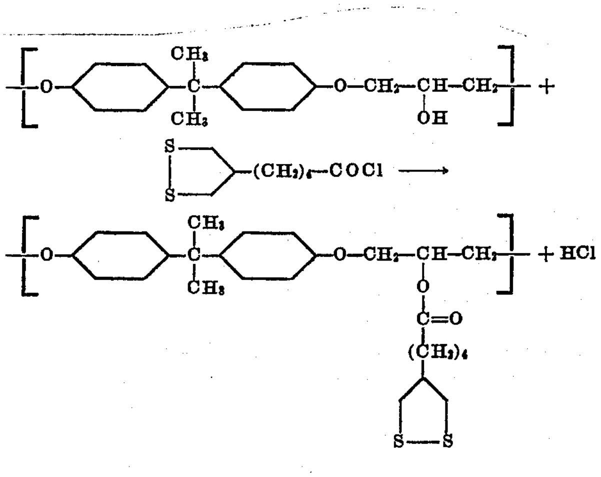

As can be seen from the above the 1,2 dithiacycloalkane (or O-dithialane) ring of the side chain remains intact and retains its photosensitivity. This sensitivity of the side chain imparts corresponding sensitivity to the colloid backbone which illustrate the sensitization of the general class of hydroxy containing colloids whose synthesization may be illustrated by the general reaction

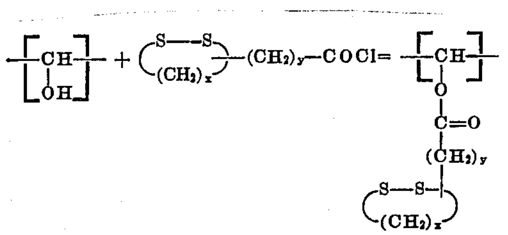

These esterified combined sensitizer/colloid compositions are photopolymerizable and may be used per se. However, in the preferred form for improved film properties and etch resistance, these esterified compositions are incorporated for their sensitizer functions with conventional supplemental or secondary colloids such as indicated above. These supplemental colloids can be either the same as or different from the colloid backbone of the esterified embodiment.

In use these sensitizer/colloid compositions are applied, as above, in solution, as a film to a support element which, after drying, may be suitably exposed and developed into the desired photoresist image. Any inert solvent may be employed in view of its sole function as a mere vehicle for coating of the photosensitive composition on the support element, and the selection of the solvent may include those enumerated above. The solids content, e.g., of the composition, needs only be sufficient to provide the desired film thickness of the composition, and this normally may range from about 5 to about 30 wt. %.

With compositions containing the sensitizer esterified colloids in conjunction with supplemental colloids, the ratio of the esterified colloid to the supplemental colloid may be in the general range of about 1:1 to about 1:10, and preferably in the range of about 1:5 to about 1:8.

The following non limiting examples are given to illustrate the preparation of the 1,2 dithiacycloalkane sensitizers

EXAMPLE I

Compound A

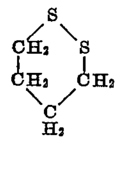

1,2-dithiacyclohexane

This compound was prepared by the ferric chloride oxidation of 1,4 dithiabutane according to the procedure of Barltrop, Hayes and Calvin, J.Am.Chem.Soc. 76 434s (1954).

Compound B 1,2-dithiacyclopentane 3-carboxy methanoic acid

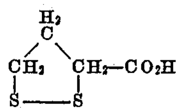

This compound was prepared by the ferric chloride oxidation of 1,3-dithiabutanoic acid according to the procedure of B. Wladislaw, Chem. & Ind. 1957 pp. 263–264.

Compound C 1,2-dithiacyclopentane-4-methanoic acid

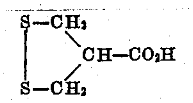

This compound was prepared according to the procedure of Schotte and Storm, Acta Chem. Scand, 10, 687 (1956)

Compound D 1,2-dithiacyclopentane-4-propanoic acid

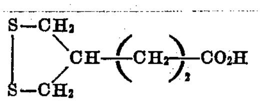

This compound was prepared in accordance with the procedure of Frisell and Bergson, Arkiv for Kemi 25, 263 (1967).

Compound E 1,2-dithiacyclopentane-4-butanoic acid,

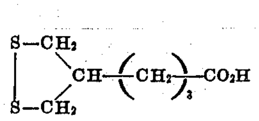

The procedure of Frisell and Bergson, ibid, was also used in preparing this compound.

Compound F 1,2-dithiacyclopentane-4-Methanoic acid methyl ester

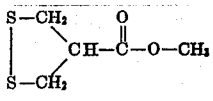

This compound was prepared according to the procedure of Krackov, Bergson, Brezois and Mautner, J.Am.Chem.Soc. 84, 1,759 (1966) by the reaction of diazomethane with the above compound C (e.g. 1,2-dithiacyclopentane-4-methanoic acid).

Compound G 1, 2-dithiacyclopentane-3-ethanoic acid

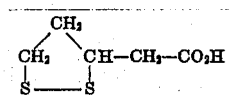

This procedure Wladislaw above was also used to prepare this compound.

Compound H 1,2-dithiacyclopentane-3-acetoxy-5-pentanoic acid

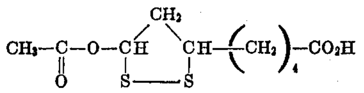

This compound was prepared according to I. Saito and S. Fukui, J. Vitaminol; 12 244–9(1966); Chem. Abstr. 66 2,502 (1966)

EXAMPLE II

To a solution of 15.0 grams of Goodyear NR cyclized polyisoprene in 100 milliliters of xylene solvent was added 2 grams of 1,2-dithiacyclopentane-4-pentanoic acid obtained from the Sigma Chemical Co., and the resultant solution spin coated on a thermally oxidized surface of a silicon semiconductor substrate, to provide, on drying, a 0.5 to 2.0 micron thick resist film. The resist coated support element was then prebaked for 10 minutes at 60°C., and selectively exposed to a 200 watt mercury arc from 5 seconds for one sample and 10 to 50 seconds for additional samples. After exposure, the resist was developed for 3 minutes in xylene, and post-baked at 100°C for 20 minutes in a $N_2$ oven. Although relatively poor images were obtained for the 5 second exposed sample, the remaining samples exposed for 10 to 20 seconds gave well defined resist images. The resist easily withstood etching of the exposed oxide with HF.

EXAMPLE III

A solution of 15 grams of Goodyear Rubber Labs cyclized polyisoprene NR in 75 mls. xylene was sensitized with 2 grams of 1,2-dithiacyclopentane-3-acetoxy-5 pentanoic acid, (compound H above) and then spin cast on a 10,000 A thick thermal oxide surface of a silicon semi conductor substrate. The coated substrate was then prebaked at 70° C for 8 minutes and exposed for 25 seconds to a 200 watt mercury lamp through a chrome mask. After exposure, the resist was developed for 3 minutes in xylene followed by a post-bake at 100° C for 20 minutes in a $N_2$ oven. The resultant resist image was characterized with a resolution defining 2.0 micron width lines of the exposed oxide for etching with buffered hydrofluoric acid.

EXAMPLE IV

The preceding Example III was repeated with the exception that the cyclized polyisoprene was sensitized with 2.0 grams of 1,2-dithiacyclopentane-3-methanoic acid (compound B). After exposure and development, the resolution of the resist image was sufficient to define 2.0 micron width lines.

EXAMPLE V

The above Example III was again repeated with the exception that the polyisoprene colloid thereof was sensitized with 1,2-dithiacyclopentane-4-methanoic acid (compound C) with like well defined resolution after exposure and development.

EXAMPLE VI

The procedure of Example III was again repeated with the exception of the sensitization of the colloid with 1,2-dithiacyclopentane-4-propanoic acid (compound D) which composition also provided sharp resist images with like resolution which defined 2.0 micron width lines.

EXAMPLE VII

The same Example III was again repeated with substitution of 1,2-dithiacyclopentane 3-ethanoic acid (compound G) for sensitization of the base resin colloid, with sharp resolution also obtained (e.g. definition of 2.0 micron width lines) after exposure and development.

EXAMPLES VIII TO X

A further repetition of Example III was performed with the exceptions of substituting 1,2-dithiacyclohexane (compound A) for sensitization of the colloid in Example VIII, the substituting of methyl-1,2-dithiacyclopentane-4-methanoate (compound F) in Example IX, and the substituting of 1,2-dithiacyclopentane-4-butanoic acid (compound E) in Example X for sensitization of the colloid. After exposure and development in each of Examples VIII to X, sharp resist images were obtained with a resolution to define lines of 2.0 micron width.

EXAMPLES XI–XVIII

The following eight examples were carried out to determine the extent of sensitization of various colloids and other polymeric resin with 1,2 dithiacyclopentane-3-pentanoic acid obtained from the Sigma Chemical Co. In each of the eight examples, 15 gms. of a different colloid were dissolved in 75ml. of xylene, and each colloid solution was sensitized with the same indicated sensitizer for these examples. The solutions were then individually spin cast at 5,000 rpm to provide a resist film of 1.5 micron thickness on the thermally oxidized surface of silicon wafers and also on chrome coated glass substrates. Each coated wafer was exposed to a 200 watt mercury arc for the below indicated times, developed and post baked at 100°C in a $N_2$ oven for 20 minutes. Evaluations were based on the resolutions obtained in the resultant image in defining 2.0 micron lines. The variation and/or deviations from the procedures employed are noted below for the specific example involved.

| EX | Colloid or Base Resin (supplier) | Solvent | Exposure Time (secs) |
|---|---|---|---|
| XI | Polyisobutylene (Borden Chem.Co.) | 75ml xylene | 40 |
| XII | Polymethylmethacrylate (Rohm and Haas) | 75ml xylene | 50 |
| XIII | Polyvinylcinnamate(Polysciences,Inc.) | 75ml.xylene | 5 |
| XIV | Pheno-formaldehyde Novolak,e.g. American Hoechest (Alvonol 429K) | 75ml. xylene | 60 |
| XV | Polychlorobutadiene (Dupont Neoprene W) | 75ml. xylene | 30 |
| XVI | Polyisopropylstyrene,-- (Borden Chem. Co.) | 75ml. xylene | 50 |
| XVII | Styrene-Butadiene Copolymer SB-S (Goodyear Rubber Co.) | 75ml. xylene | 30 |
| XVIII | Polyvinylpyrollidone,--(GAF) | 75ml. xylene | 60 |

Sharp resist images with high resolution of 2.0 micron width lines were obtained with the colloids of Examples XI, XIII, XV, XVI, and XVII which readily withstood etching of exposed oxidized surface of the wafers with HF and also the etching of the chrome film of the glass substrate with Ce $SO_4$ and with $KMNO_4$/OH. Relatively poor, although definable resist images were obtained in Example XII. In contrast, no images were obtained with the synthetic polymers of Examples XIV and XVIII nor with other normal exposures of conventional duration with it being understood that it does not preclude formation of images with exposure of extended duration. In general, the experimentation was designed for the determination of the quantum efficiency of photoinsolubilization and selection of polymers characterized with a high exposure efficiency. Thus exposure times were limited to practical considerations.

EXAMPLE XIX 1,2-dithiacyclopentane-3-pentanoyl chloride was obtained by the reaction of $SOCl_2$ with the acid followed by reaction with polyvinyl alcohol (Gelvatol-1-90 Monsanto) by interfacial polymerization. One mole of the acid chloride dissolved in $CH_2Cl_2$ was added to 1 mole of polyvinyl alcohol dissolved in 1 mole of base. The reaction mixture was stirred for 24 hours at 5°C and the polymeric product was precipated out of the dichloromethane with alcohol. Several precipitations using dichloromethane/alcohol produced a yellow polymer. Infra red and elemental analysis confirmed the formation of ester linkage and incorporation of a disulfide group into the polymer.

Ten percent of this polymer was dissolved in methyl cellosolve acetate and spun on thermal oxide. The film formed was hazy but no pinholes were found. The film was also slightly tacky. Selective exposure to a mercury arc and development in cyclohexane formed an etch resistant image. The resist did not withstand 30 minute immersion in a ph 14 alkali but withstood immersion at a lower ph 12. Resistance to acids was good. Better film formation and etch resistance to alkali was obtained by incorporating the polymer, 10 percent by wt., in cyclized rubber and spin casting this mixture from cyclohexanone/xylene 50/50 by volume. Good images were obtained as well as strong alkali etch resistance. Negative images (area exposed hardened) were formed.

EXAMPLE XX

Another form of sensitizer esterified colloids was obtained by reaction of the 1,2-dithiacyclopentane-3-pentanoyl chloride with epichlorohydrin-epoxy copolymer (Shell Chemical Co.)

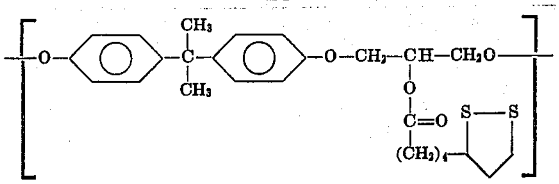

This reaction was carried out in pyridine at 25° C for 12 hours using equimolar reactants. Solvent fractionation afforded a pale yellow polymer. This polymer gave good films but they tended to be tacky. Films were cast from cyclohexanone on a thermally oxidized surface of silicon wafers, exposed and developed with the same solvent. Alkali resistance was sufficient to withstand on alkali ph 14 immersion. Sharp negative images were formed for etching thermal oxide.

While this invention has been particularly described with reference to the preferred embodiment thereof, it will be understood by those skilled in the art that the foregoing and other changes in form and details may be made therein without departing from the spirit and scope of the invention.

What is claimed is:

1. A light sensitive composition comprising an organic solvent-soluble colloid constituent and a 1,2-dithiacycloalkane constituent.

2. The composition of claim 1 wherein said 1,2-dithiacycloalkane has a four to seven member ring structure containing two adjacent sulfur groups and two to five methylene groups.

3. The composition of claim 1 wherein the second said constituent has the formula

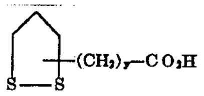

wherein Y is an integer from 0 to 4.

4. A light sensitive composition comprising an unsaturated organic solvent-soluble colloid and a 1,2-dithiacycloalkane compound.

5. The composition of claim 4 wherein said 1,2-dithiacycloalkane has a four to seven ring structure containing two adjacent sulfur groups and two to five methylene groups.

6. The composition of claim 4 wherein said compound has the formula

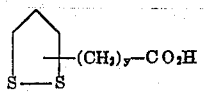

wherein Y is an integer from 0 to 4.

7. The composition of claim 4 wherein the second said constituent comprised a 1,2-dithiacycloalkanoate side chain of said colloid constituent, wherein said colloid is a member selected from the group consisting of polyvinyl alcohols and hydroxy alkyds.

8. The composition of claim 7 which includes an unsaturated organic solvent-soluble second colloid.

9. The composition of claim 1 where both said constituents comprise a 1,2-dithiacycloalkanoate of a hydroxy containing colloids.

10. The composition of claim 9 which includes an unsaturated organic solvent-soluble second colloid.

11. The composition of claim 9 wherein said alkanoate has the acyl radical structure

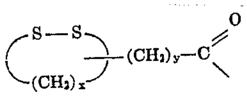

wherein *X* is an integer from 2 to 5, and *Y* is an integer of 0 to 4.

12. The composition of claim 11 which includes an unsaturated organic solvent-soluble second colloid.

13. The composition of claim 11 wherein said alkanoate is 1,2-dithiacyclopentane-3-pentanoate.

14. The composition of claim 13 which includes an unsaturated organic solvent-soluble second colloid.

15. A light sensitive element comprising a support and a coating thereon of a composition comprising an organic solvent-soluble colloid constituent and a 1,2-dithiacycloalklane constituent.

16. The element of claim 15 wherein said support comprises a semiconductor substrate and the second said constituent has a four to seven member ring structure containing two adjacent sulfur groups and two to five methylene groups.

17. The element of claim 15 wherein said support comprises a semiconductor substrate and the second said constituent is an acid of the formula

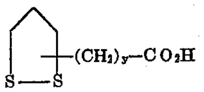

wherein Y is an integer from 0 to 4.

18. The element of claim 17 wherein said acid is 1,2-dithiacyclopentane-3-pentanoic acid.

19. A light sensitive element comprising a support and a coating thereof of a composition comprising an unsaturated organic solvent-soluble colloid and a 1,2-dithiacycloalkane compound.

20. The element of claim 19 wherein said support comprises a semiconductor substrate and said compound has a four to seven member ring structure containing two adjacent sulfur groups and two to five methylene groups.

21. The element of claim 19 wherein said support comprises a semiconductor substrate and said compound is an acid of the formula

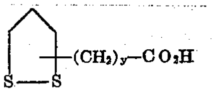

wherein Y is an integer from 0 to 4.

22. The element of claim 21 wherein said acid is 1,2-dithiacyclopentane-3-pentanoic acid.

23. The element of claim 15 wherein the second said constituent comprises a 1,2-dithiacycloalkanoate side chain of said colloid constituent wherein said colloid is a hydroxy containing colloid.

24. The element of claim 23 which includes an unsaturated organic solvent-soluble second colloid.

25. The element of claim 15 wherein both said constituents comprise a 1,2-dithiacycloalkanoate of a hydroxy containing colloid.

26. The element of claim 25 which includes an unsaturated organic solvent-soluble second colloid.

27. The element of claim 25 wherein said alkanoate has the acyl radical structure

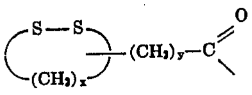
wherein X is an integer from 2 to 5, and Y is an integer of 0 to 4.
28. The element of claim 27 which includes an unsaturated organic solvent-soluble second colloid.
29. The element of claim 27 wherein said alkanoate is a 1,2-dithiacyclopentane-3-pentanoate.
30. The element of claim 29 which includes an unsaturated organic solvent-soluble second colloid.
* * * * *